US 6,597,048 B1

(12) United States Patent
Kan

(10) Patent No.: US 6,597,048 B1
(45) Date of Patent: Jul. 22, 2003

(54) ELECTROSTATICALLY CHARGED MICROSTRUCTURES

(75) Inventor: Edwin C. Kan, Ithaca, NY (US)

(73) Assignee: Cornell Research Foundation, Ithaca, NY (US)

( * ) Notice: Subject to any disclaimer, the term of this patent is extended or adjusted under 35 U.S.C. 154(b) by 0 days.

(21) Appl. No.: 09/828,991

(22) Filed: Apr. 10, 2001

Related U.S. Application Data

(60) Provisional application No. 60/268,025, filed on Feb. 13, 2001, and provisional application No. 60/257,300, filed on Dec. 26, 2000.

(51) Int. Cl.$^7$ .......................... H01L 29/84; H01L 29/86
(52) U.S. Cl. ...................... 257/415; 257/419; 257/420; 257/315
(58) Field of Search ................................ 257/415, 419, 257/420, 315

(56) References Cited

U.S. PATENT DOCUMENTS

| 5,015,906 | A | * | 5/1991 | Cho et al. ................ 310/309 |
|---|---|---|---|---|
| 5,479,061 | A | * | 12/1995 | Bobbio et al. ............. 200/1 R |
| 5,831,164 | A | * | 11/1998 | Reddi et al. ................ 73/510 |
| 5,955,818 | A | * | 9/1999 | Bertin et al. ................ 216/33 |
| 6,204,544 | B1 | * | 3/2001 | Wang et al. ............... 257/252 |
| 6,300,156 | B1 | * | 10/2001 | Decker et al. ............. 438/415 |

OTHER PUBLICATIONS

C. Diorio, P. Hasler, B.A. Minch and C.A. Mead, "A floating–gate MOS learning array with locally computed weight updates," IEEE Trans. Electron Devices, vol. 44, pp. 2281–2289, 1997.

J.R. Tucker, "Schottky barrier MOSFETs for Silicon nano-electronics," Advanced Workshop on Frontiers in Electronics, WOFE'97 Proceedings, pp. 97–100, 1997.

C. Wang, J.P. Snyder and J.R. Tucker, "Sub–40 nm PtSi Schottky source/drain metal–oxide–semiconductor field–effect transistors," Appl. Phys. Lett, vol. 74, pp. 1174–1176, 1999.

V. Narayanan, Z. Liu, Y.M.N. Shen, M. Kim and E.C. Kan, "Reduction of metal–semiconductor contact resistance by embedded nanocrystals," IEDM Tech. Dig., pp. 87–90, 2000.

E.C. Kan and Z. Liu, "Directed self–assembly process for nano–electronic devices and interconnect," Superlattices and Microstructures, vol. 27, pp. 473–479, 2000.

Z. Liu, M. Kim, V. Narayanan, and E.C. Kan, "Process and device characteristics of self–assembled metal nano–crystal EEPROM," Superlattices and Microstructures, vol. 28, pp. 393–399, 2000.

Z. Suo and Z. Zhang, Epitaxial films stabilized by long range forces, Phys. Rev. B, vol. 58, pp. 5116–5120, 1998.

D.A. Bonnell, Y. Liang, M. Wagner, D. Carroll and M. Buhle, "Effect of size dependent interface properties on stability of metal clusters on ceramic substrates," Acta Mater., vol. 46, pp. 2263–2270, 1970.

Z. Liu, V. Narayanan, M. Kim, G. Pei and E.C. Kan, "Low programming voltages and long retention time in metal nanocrystal EEPROM devices," 59th DRC Tech. Dig., pp. 79–80, 2001.

H.C. Lin, E.C. Kan, T. Yamanaka & C.R. Helms, "Modeling and characterization of Si/SiO2 interface roughness," VLSI Tech. Symp., Kyoto, Japan, Jun. 1997.

(List continued on next page.)

Primary Examiner—Jerome Jackson
(74) Attorney, Agent, or Firm—Jones, Tullar & Cooper, P.C.

(57) ABSTRACT

A process and apparatus for injecting electrostatic charges into opposing elements of MEMS structures to produce repulsing forces between the elements. These forces tend to produce controlled spacing between components to prevent sticking and to provide friction-free relative movement.

53 Claims, 3 Drawing Sheets

OTHER PUBLICATIONS

J. Kedzierski, P. Xuan, E.H. Anderson, J. Bokor, T.J. King and C. Hu, "Complementary silicide source/drain thin–body MOSFETs for the 20nm gate length regime," IEDM Tech. Dig., pp. 57–60, 2000.

J. Kedzierski, P. Xuan, V. Subramanian, E.H. Anderson, J. Bokor, T.J. King and C. Hu, "A 20–nm gate–length ultra–thin body p–MOSFET with silicide source/drain," Si Nanoelectronics Workshop, VLSI Tech. Symp., pp. 13–15, Honolulu, Hawaii, Jun. 2000.

\* cited by examiner

ELECTROSTATICALLY CHARGED MICROSTRUCTURES

This application claims the benefit of U.S. Provisional Application No. 60/257,300, filed Dec. 26, 2000 and of Provisional Application No. 60/268,025, filed Feb. 13, 2001, the disclosures of which are incorporated herein by reference.

BACKGROUND OF THE INVENTION

The present invention relates, in general, to nanofabricated structures, and more particularly to microelectromechanical structures incorporating floating nonvolatile electrostatic charges in relatively movable components.

The growth of integrated heterogeneous technology in recent years has opened many new opportunities for "system-on-a-chip" applications, particularly with the introduction of microelectromechanical systems (MEMS) technology. This technology has produced many interesting applications of sensing and actuation devices and techniques, although the mechanical properties of MEMS structures are limiting. However, many key functions, such as power and communication, are still very difficult to attain with MEMS devices, For example, one of the mechanical limitations is that the mass of a MEMS device is usually small and not adjustable, so it is difficult to control mechanical harmonics after the device has been fabricated. Therefore, in order to regulate the mechanical properties of a MEMS device, for example to provide mechanical harmonic control for audio/ultrasound microphones and speakers, it has been necessary to design the geometry of the device in such a way as to control stress conditions. Further, it has been necessary to control material density, during the fabrication process, but this cannot be changed after the structure has been produced.

Another difficulty encountered in the past is due to the fact that the sensing of motion in MEMS devices has been done by measuring variations in capacitance caused by the motion, which requires an external power source. Power generation by movable MEMS devices has been achieved only through a voltage elevation produced by induced charges in capacitor plates, which also requires an external voltage source. In the area of communications, the use of MEMS devices as antennas for generating electromagnetic waves has been severely limited by the size of these devices, and by their high-Q inductance.

In addition, movable microstructures in MEMS devices suffer from deterioration caused by friction and consequent wear due to the inevitable physical contact between adjacent relatively movable components. This is a particularly serious problem for applications such as hinges and bearing structures such as might be found in micro-turbine or micro-motor devices. Such physical contact is often due to the attractive forces, such as Van de Walls forces, which may hold very small low mass microstructures together with such force that it is difficult to pry them apart without destroying them, and the resulting frictional wear can severely limit the usefulness and the lifetime of such structures.

Accordingly, there is a need to provide improved MEMS devices and processes which will reduce frictional contact between relatively movable structures to provide friction and wear-free micromechanical structures; which permit active waveform sensing and low-power generator applications without the need for external power; which will provide adaptive and reconfigurable mechanical harmonic control for MEMS devices such as audio or ultrasound microphones and speakers; which will allow the creation of self-contained microsystems; and which will provide a capability for wireless communication.

SUMMARY OF THE INVENTION

In accordance with the present invention, problems encountered with prior MEMS devices are overcome through the introduction into MEMS structures of floating nonvolatile electrical charges, such as those available in commercial electrically erasable programmable read-only memory (EEPROM) devices. These floating charges are injected into "floating gate structures" in MEMS devices, which may be released, movable polysilicon membranes, beams, or other movable or fixed MEMS structures or devices incorporating electrically conductive or semiconductive layers or segments capable of receiving and retaining electrostatic charges. Such structures will hereinafter be referred to as floating gate structures or electrostatically charged membranes or beams. The floating gate structures preferably are embedded in a dielectric such as $SiO_2$, so that charges can be retained over a long period of time, for example, 10 years or more. The electrostatic forces produced by these charges can be much larger ($10$–$10^6$ times larger) than the Newtonian forces which act on microstructures below the dimension of 100 $\mu$m. As a result, these electrostatic forces can greatly modify the effective mechanical properties of the MEMS structures or devices to which they are applied, and because they can be externally controlled, the properties of the MEMS device can easily be reconfigured during both the fabrication and operation of the MEMS device.

A preferred method of providing the electrostatic charges in a MEMS device or structure is by way of EEPROM devices having floating gate structures connected to the MEMS structure. The floating gate structure of an EEPROM device is made of polysilicon embedded in insulating dielectrics, and extends outside the EEPROM structure. This exterior floating gate is electrically connected to a moving beam or similar structure of a MEMS device which optionally can be embedded in a very thin passivation dielectric layer. EEPROM devices can be readily provided for in the design and fabrication of MEMS structures, and these devices permit real-time reconfiguration and control of the resulting structures. The injection of floating charges into MEMS structures produces repulsive electrostatic forces between adjacent structures or layers having floating charges of the same polarity, and it has been found that the provision of these forces overcomes the problem of friction and wear in MEMS devices. Thus, for example, repulsive forces can be used to produce friction-free and wear-free microbearings, hinges and turbines whose reliability previously has been limited to $10^3$–$10^6$ rotations before failure. For geometrical dimensions below about 100 $\mu$m, the electrostatic forces between static charges of the same polarity in MEMS devices are more than strong enough to support the light mass of such structures. For applications where image charges may reduce the effectiveness of static charges, nano-crystal floating gate structures can be employed, and if the ambient gas pressure is lowered by sealing the device in a low pressure environment, the resulting mechanical structure can have extremely low damping characteristics.

The provision of floating charges on movable or vibrating MEMS structures can also revolutionize applications that have previously relied on time-varying capacitance sensing during mechanical movement. For example, in many commerical microphones, vibrating polymer layers have been used to induce waveforms for sensing, but floating charges produced in a MEMS device by an EEPROM can be much stronger in density, easier to program and thus to control, and will last longer than a charged polymer. Further, the vibration of a MEMS structure containing floating charges in accordance with the invention may serve as a transducer to convert mechanical motion to electrical power. This permits a mechanical structure with embedded floating charges to be fabricated on a substrate, or chip, and to be used for on-chip power generation, thereby resolving one of the most serious problems in sub-millimeter autonomous systems. For example, such a transducer may include a floating membrane, which may be highly doped polysilicon layer, located between, and movable with respect to, upper and lower spaced conductive layers. The spaced conductors and the membrane are initially electrically connected to a floating gate of an EEPROM device which is biased to inject electrostatic charges into floating gate structures of the stationary conductors and the floating membrane. Thereafter, motion of the membrane with respect to the conductors induces an AC current in the adjacent conductive layers to produce a usable quantity of electrical power for applications such as biomedical and environmental sensors and actuators, pacemakers, etc.

The static charges embedded in a floating membrane and the adjacent conductors by the EEPROM cell effectively increase the inertia of the membrane and change its mechanical behavior. Thus, for example, the mechanical properties of vibration of a MEMS structure, including its resonant frequency, can be modified by controlling the amount of the floating charge applied to it, as well as by careful design of its geometric layout and control of the fabrication process. These properties can be dynamically reconfigured by controlling the EEPROM which supplies the static charge. Such a device can be used, for example, to detect mechanical vibration of the membrane and thus can be used for mechanical harmonic signature recognition. The sensing membrane motion can be passive, as by inducing an electrical signal waveform in the conductive plates, instead of by measurement of capacitance variations.

The motion of the membrane can also be used to provide vibration-based generation of electromagnetic (EM) waves for wireless telemetry. Such waves, which are dissipated from moving static charges, will be of relatively low power, but will provide near-field and short range EM communication.

When floating charges of the same polarity are injected into both components of a relatively movable mechanical structure, through connection to EEPROM devices, the repulsive force produced by the charges on both components will maintain a floating structure in an equilibrium position with respect to a fixed structure, and will provide protection against contact between the components due to mechanical impact. This significantly reduces wear in the structure and increases its reliability. Such relatively movable structures include mechanical hinge devices, comb-type drive actuators having interdigitated fingers, spring structures for supporting the comb drives, bearings, turbine structures, and the like. Repulsive-force electrostatic charges applied to such mechanical structures maintain separation between adjacent components and overcome stress gradients that can, for example, cause comb-finger tilting and related problems. It has been found that if the separation gap between adjacent structures is larger than about 10 nm, friction which originates from Van de Wall surface forces can be substantially eliminated.

In accordance with the invention, MEMS structures are integrated with, and are electrically connected to, EEPROM devices on a single substrate for efficiency as well as for optimization of the mechanical properties. After static charges have been supplied to the MEMS devices, the EEPROM structures can be etched away, as during the MEMS release step, or the EEPROM structures can be maintained on separate islands but in connection with the mechanical structure to permit dynamic tuning of the floating charge. Alternatively, a charge can be transported to a moving structure from an attached EEPROM, with the metal interconnect being broken by the initial mechanical motion of the structure, leaving the EEPROM and its floating gate intact.

BRIEF DESCRIPTION OF THE DRAWINGS

The foregoing, and additional objects, features and advantages of the present invention will become apparent to those of skill in the art from the following detailed description of preferred embodiments thereof, taken in conjunction with the accompanying drawings, in which.

DESCRIPTION OF PREFERRED EMBODIMENTS

As discussed above, the invention is directed to a process and apparatus for injecting electrostatic charges of the same polarity into opposing relatively movable MEMS structures to produce repulsing forces tending to separate adjacent elements of the structures, and is further directed to the resulting MEMS devices. The repulsing charges produce spacing between adjacent elements of the MEMS device to prevent mechanical contact, with the spacing being controllable by adjustment of the magnitude of the electrostatic charges. Relative motion between adjacent elements can be produced by varying the magnitude of the electrostatic charges, and the relative motion of elements can be measured by sensing variations in charges induced in adjacent electrodes. Such relative motion can also be used for electrostatic power generation and for generation of EMS waves for communications.

Figure 1:
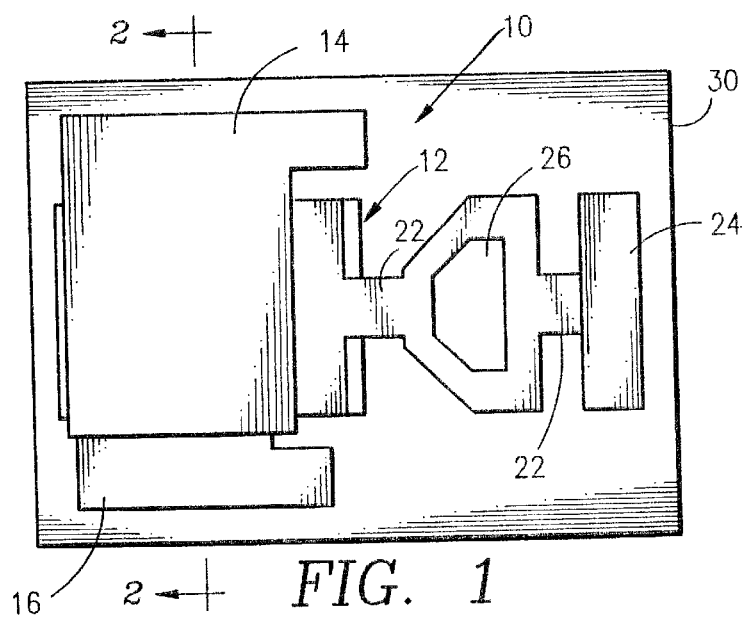
FIG. 1 is a top plan view of an integrated MEMS and EEPROM device illustrating an electrostatic floating gate structure in accordance with the invention.
Figure 2:
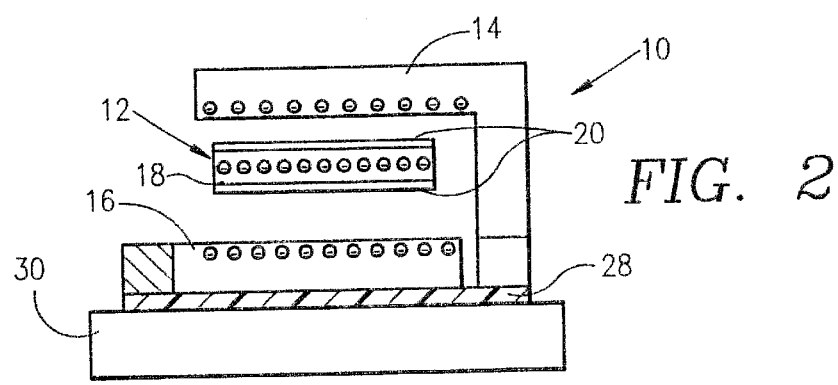
FIG. 2 is a cross-section taken along lines 2—2 of FIG. 1.

The basic concept of the present invention is illustrated in FIGS. 1 and 2, wherein a microstructure such as a MEMS device 10 incorporates at least two spaced components which may be fixed or relatively movable. The illustrated device includes a low-mass movable membrane 12 located between upper and lower electrodes 14 and 16, respectively. The membrane incorporates a floating gate structure 18 embedded in a dielectric 20 such as a polysilicon thin film. The membrane 12 is connected through a thin film connecting layer 22 to an electrically erasable programmable read-only memory (EEPROM) device 24, the layer 22 being carried by a mechanical support 26.

Both the MEMS device 10 and the EEPROM device 24 are fabricated on an insulating layer 28 on the top surface of a substrate 30 in conventional manner. The EEPROM device, which may be fabricated first, incorporates a writing gate which may be connected to the thin film connecting layer 22 to provide electrical connection between the EEPROM and the movable membrane 12 of the MEMS device. The device 10 is fabricated, using conventional MEMS micromachining procedures, from a layered stack formed on the insulating layer 28, which may be an oxide layer. This stack may include a metal layer which corresponds to the electrode 16, a sacrificial oxide layer (not shown in the figures), a polysilicon layer which corresponds to the floating gate structure 18, a second sacrificial oxide layer (not shown), and a top metal layer which corresponds to electrode 14. After conventional surface micromachining steps define the MEMS structure and the floating polysilicon membrane 12 that is an extension of connecting layer 22, a writing bias condition is applied to the EEPROM to supply electrostatic charges to the membrane by way of that connecting layer. The floating electrostatic charges are injected into the floating gate structure 18, in the membrane 12 through Fowler-Nordheim tunneling or hot-carrier effects. Such charges can be retained in the gate structure 18 for more than 10 years. A typical programming and erasing time for embedding the charges in the membrane 12 is on the order of a millisecond, and varies with different device designs and transport mechanisms.

The membrane 12 is illustrated in FIGS. 1 and 2 as being supported in cantilever fashion from support 26 by way of the thin film connector 22. However, it should be understood that before the structure is completed, the EEPROM floating gate is also electrically connected to the mechanical structure for the electrodes 14 and 16, so that electrostatic charges can be supplied to these electrodes as well as to the membrane. Alternatively, separate EEPROM devices can be provided for these electrodes.

Following electrostatic charging of the MEMS structure, further micromachining may be done to release the membrane 12 completely so that it floats freely between the upper and lower electrodes 14 and 16, as illustrated in FIG. 2. Alternatively, the connecting layer 22 may remain in place to support the membrane as a cantilever and to permit continued control of the charge on the membrane by regulating the EEPROM device 24.

The electrostatic forces generated between the membrane and the adjacent electrodes can be much larger than the effect of gravity; for example, these forces can be in a range of $10-10^6$ times the Newtonian forces for microstructures having dimensions of less than 100 $\mu$m. These static floating charges are, therefore, sufficiently strong to support the light mass of a MEMS structure such as that illustrated. If the ambient gas pressure around the membrane is removed, as by sealing the device in a low pressure chamber, the final structure will have extremely low damping.

As discussed above, the charges on the membrane 12 effectively change its inertia to a significant degree, allowing the EEPROM to greatly modify the mechanical properties of the device. These properties are initially established during the design of the geometry of the floating layer, which can be accurately carried out using standard lithography techniques.

Repulsive electrostatic forces such as those established between the membrane 12 and the upper and lower electrodes 14 and 16 can be utilized in other MEMS structures, as will be described below, to solve friction and wear problems in such microstructures. The embedded static charges can be used to induce active waveforms in the conductive plates through relative motion of the membrane, as described above.

Figure 3:
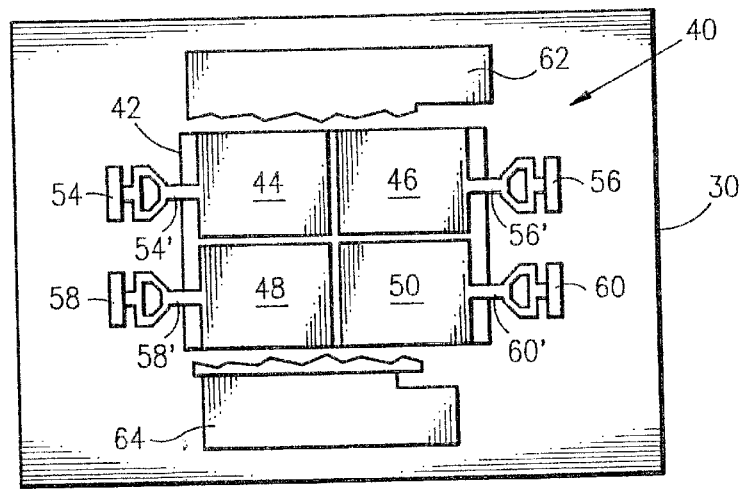
FIG. 3 is a top plan view, partially cut away, of a modification of the device of FIG. 1.

The mechanical properties of the movable membrane 12, including its resonance frequency and the generation of harmonics, can be modified not only by varying the floating charges on the floating gate structure 18 in membrane 12, but also by changing the layout of the floating gate structure, as illustrated, for example, in FIG. 3. As there illustrated, a vibratory MEMS structure generally indicated at 40 includes a floating membrane 42 which is similar to membrane 12, but which incorporates, for example, four floating gate structures 44, 46, 48 and 50, each connected to a corresponding EEPROM 54, 56, 58 and 60 through respective connecting layers 54', 56', 58', and 60'. The floating gate structures are fabricated in the polysilicon membrane 42 in any desired configuration and the floating charges supplied by each EEPROM are confined to the respective floating gate regions so that each floating gate structure 44, 46, 48 and 50 can have a different charge density. The effective mechanical properties of the membrane then can be dynamically reconfigured by controlling the respective EEPROMs. As with the device of FIGS. 1 and 2, the membrane 42 extends between an upper conductor 62, which is partially cut away, and a lower conductor 64, which also is partially cut away, to form a "sandwich" structure.

Figures 4, 5:
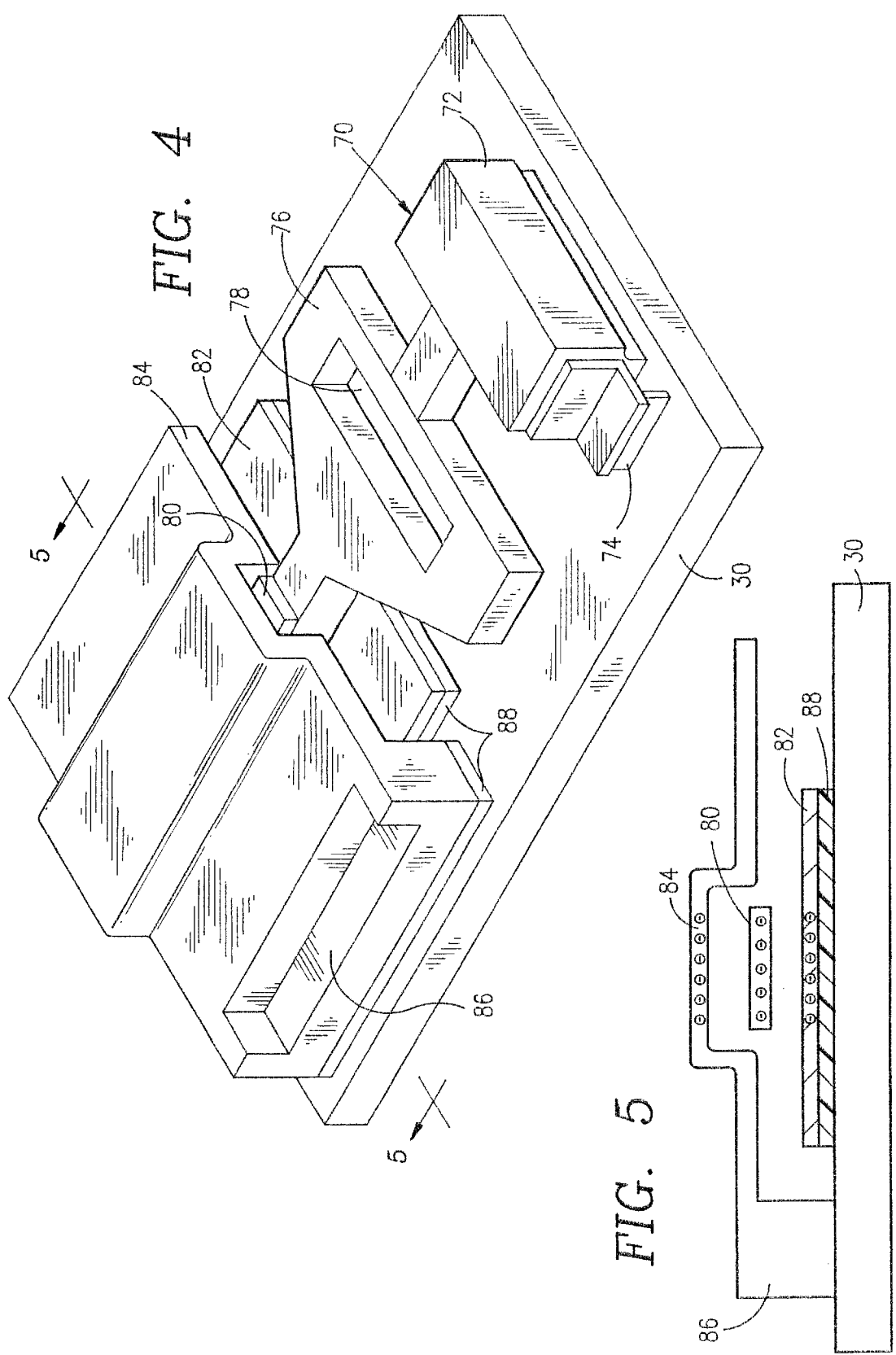
FIG. 4 is a top perspective view of a second embodiment of the invention.
FIG. 5 is a cross-section taken along lines 5—5 of FIG. 4.

A further modification of the devices of FIGS. 1, 2 and 3 is illustrated in FIGS. 4 and 5, wherein an EEPROM 70 is mounted on a substrate, as previously discussed. The EEPROM includes a control gate, generally indicated at 72, a source and drain contact, generally indicated at 74, and a floating gate (not shown) electrically connected to a connecting layer 76 which is anchored to the substrate 30 at 78. The connecting layer 76 is electrically connected to, and supports one end of, a cantilevered movable beam 80 which is similar to the membrane 12 of the previous embodiment. The movable beam 80 extends between a lower conductive plate 82 on the substrate 30 and an upper conductive plate 84 which is secured to the substrate 30 at anchor point 86 and extends in cantilever fashion over the movable beam 80. Both of the conductive plates 82 and 84 are electrically insulated from substrate 30, as by oxide layer 88. As previously discussed, the EEPROM injects electrostatic charges into the movable beam 80 as well as into the lower and upper conductive plates 82 and 84. These injected charges are of the same polarity so that the beam 80 is repelled by both of the conductor plates, as was the case with the membrane 12 in the embodiment of FIGS. 1 and 2, and the membrane 42 in FIG. 3. Subsequent variation of the charges on the movable beam 80 varies the effective mechanical properties of the movable beam to vary its resonant frequency, as described with respect to membranes 12 and 42.

Mechanical vibration of the membrane or the movable beam induces a waveform into the adjacent conductors which can be measured to detect the frequency and the amplitude of the membrane motion. Selection of the geometric shape of the device as well as selection of the electrostatic charge level can be used to provide specific mechanical resonance characteristics which can be used, for example, for harmonic signature recognition.

The motion of the membranes or beam between the conductive plates, as described above, can also be used for power generation to supply, for example, electrical circuitry located on the substrate 30. Although the power produced by the moving thin film membranes or the MEMS beam will be limited, such a device can provide sufficient power for biomedical and environmental sensors or actuators for such devices can give an estimated power generation of:

$$P_{fc} \approx C_G V_S^2 f_r \eta / Z \quad \text{(Eq. 1)}$$

where $C_G$ is the maximum capacitance during vibration, $V_S$ is the threshold voltage shift in the EEPROM structure, $f_r$ is the resonant frequency and $\eta$ is the gross efficiency (related to loss and damping in the generator). In a test of a device having a dimension of $4 \times 10^{-4}$ cm$^{-2}$, the available power $P_{fc}$ was about 1.3 $\mu$W for a resonant frequency $f_r=10$ kHz. It is estimated that $P_{fc}$ as high as 70 $\mu$W will be obtainable with this device.

The floating static charge layer in the embodiments of FIGS. 1–5 is enclosed by conductive plates for maximum waveform generation in the conductors. However, if it is desired to transmit electromagnetic (EM) waves from the moving static charges and to maximize such transmission from the described devices, the movable static-charged membrane or beam needs to protrude into free space away from the substrate and the metal interconnect layer such as layer 22 in FIG. 1 or connecter 78 in FIG. 4, and away from any covering conductors. The emitted electromagnetic waves from such a structure will have a relatively long wavelength which depends on the vibrational frequency of the membrane or movable beam, and will have small transmitted power. With such a device, the near-field wave effect will be more effective, unlike the far-field emission in radio-frequency wireless communications, so that the structure can be used for short-range EM wave emitters.

In some circumstances, induced image charges produced during vibration of the membrane or the movable beam described above can cause leakage and redistribution of floating charges, and this can have adverse effects in some applications. This leakage and redistribution can be reduced by utilizing nanocrystal based structures wherein the thin film layer which receives the floating charges incorporates conductive metal crystals of nanometer scale. Charge redistribution within such a floating gate structure is unlikely, since each nano-crystal is electrically isolated from adjacent crystals with weak between-crystal tunneling. Furthermore, charge leakage in such a device after injection is greatly reduced due to the Coulomb blockade effect. In such a device, the EEPROM device or cell is geometrically integrated with the mechanical vibratory structure, and charge injection into the nano-crystals is performed before the surface micromachining takes place, and before the EEPROM structure is removed.

Figure 6:
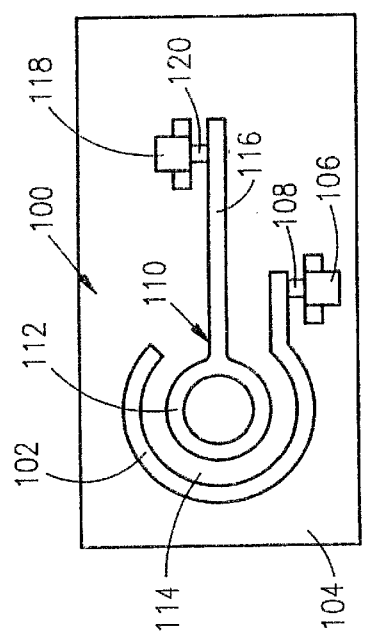
FIG. 6 is a top plan view of a third embodiment of the invention.

The use of electrostatic repulsive forces to eliminate friction and wear in micrometer to nanometer scale structures is further illustrated in FIG. 6, wherein floating charges of the same polarity are injected into adjacent components of a mechanical structure which, in the illustrated embodiment, is in the form of a hinge structure 100. The hinge includes, for example, a stationary C-shaped electrically conductive element 102 mounted on a substrate 104. Element 102 may be a highly doped polysilicon material and is connected at one end to an EEPROM device 106 by way of a connecting layer 108. A relatively movable electrically conductive element 110, which is also formed of a highly doped polysilicon material, includes a relatively large head portion 112 located within, and movable in, a central aperture 114 formed by the C-shaped stationary element 102. Element 110 also includes an elongated arm portion 116 integral with head portion 112 extending out of aperture 114. The arm portion 116 is connected to an EEPROM 118 by a connecting layer 120 through which electrostatic charges are injected into the movable element 110. This normally would be done before the movable element is released from the substrate 104. If desired during such release, the EEPROM device 118 may also be disconnected by etching through layer 120, or it may be completely removed, to permit free rotational movement of the element 110 in a plane parallel to the top surface of substrate 104, with the enlarged portion 112 rotating within aperture 114. The EEPROM 106 may remain connected to control the injection of charges into the stationary element 102 to regulate the repulsive force between the charges on elements 102 and 110. The repulsive charges on the elements 102 and 110 keep the enlarged portion 112 separated from C-shaped element 102 around its circumference, allowing relative motion between them without mechanical contact. This eliminates friction and wear, and increases the life of the structure.

As previously described, the floating gate structures of the hinge structure can be constructed with nano-crystals to virtually eliminate the possibility of instability from image charges and charge redistribution within the floating gate structure. Electrostatic force in structures such as the illustrated hinge can be very strong. For example, for a layout area of 10 $\mu$m×10 $\mu$m, with a floating charge density of $10^{-12}$ cm$^{-2}$ the repulsive force can sustain a structure of 0.02 g with a separation of 2 $\mu$m, since the Coulomb force varies with the inverse square of the distance. The repulsive force maintains the floating structure in an equilibrium position with a good cushion for impact forces, significantly reduces wear in the operation of the movable structure, and increase its reliability.

Figure 7:
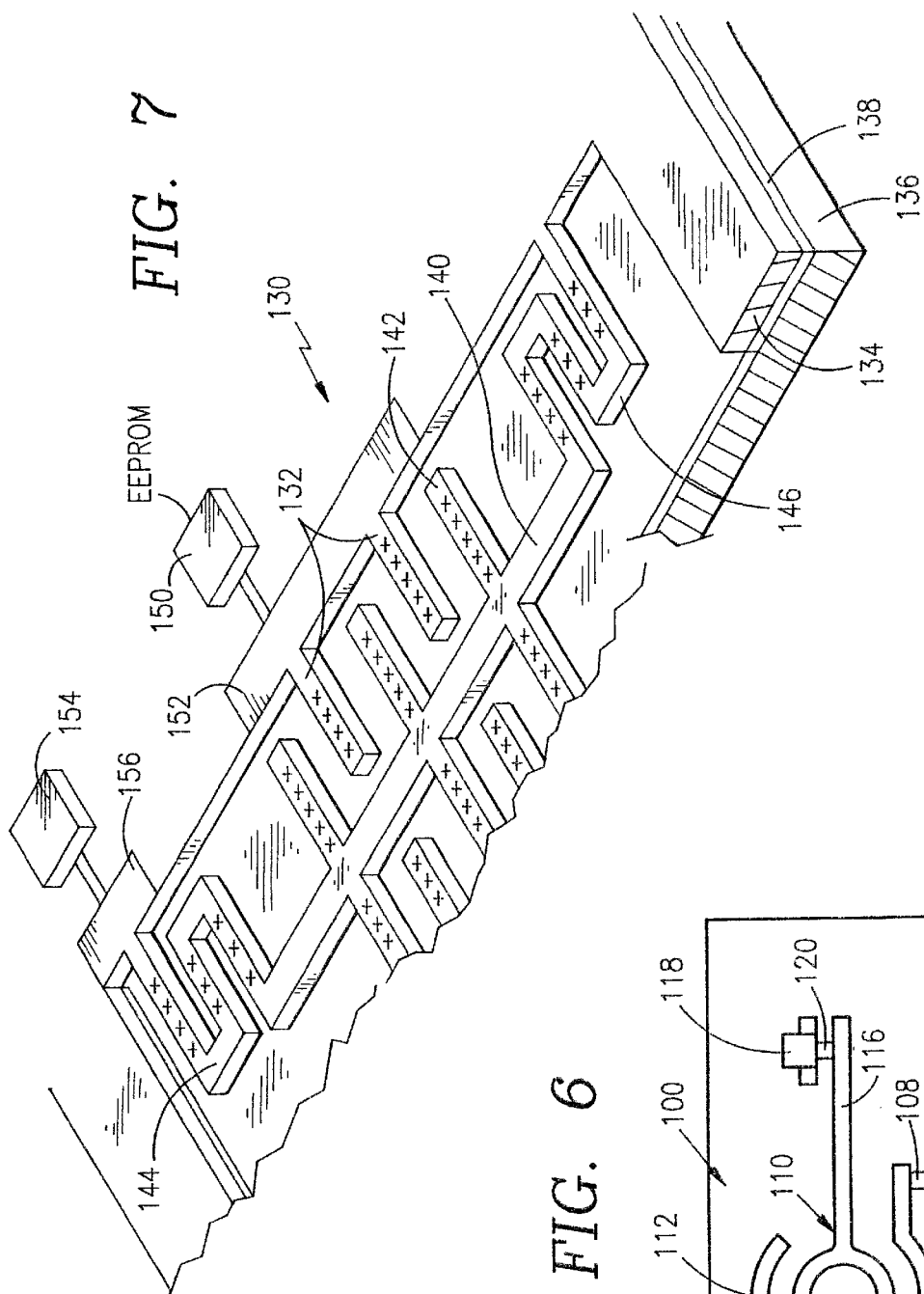
FIG. 7 is a top perspective view of a fourth embodiment of the invention.

Another embodiment of a micron-scale mechanical structure utilizing repelling electrical charges on adjacent elements is illustrated in FIG. 7, and is generally indicated at 130. The illustrated device is a MEMS comb-type actuator which includes multiple spaced, parallel stationary fingers 132 fabricated in a polysilicon layer 134 carried by a substrate 136 and separated from the substrate by, for example, an oxide layer 138. Adjacent the fingers 132 is an elongated backbone 140 which includes a number of spaced, parallel movable fingers 142 which extend between, and are interdigitated with, the stationary fingers 132. The backbone 140 is connected at opposite ends to springs 144 and 146 which support the backbone for longitudinal, or axial, motion in the plane of layer 134 and parallel to the substrate 136. A first EEPROM, diagrammatically illustrated at 150, is mounted on the substrate 136 and is connected to the fixed portion of comb structure 130 by way of a connective layer 156, illustrated at 152. A second EEPROM 154 is connected by a connector layer 156 to the movable components of the comb structure 130, although it will be understood that a single EEPROM may be utilized, if desired.

The comb structure 130 and the EEPROM devices, 150 and 154 illustrated in FIG. 7 preferably are fabricated on the substrate 136 utilizing conventional processes, including conventional surface machining for the MEMS comb structure 130. If desired, additional etching of the released comb structure 130 may be performed to increase the vertical separation between the movable structure and the substrate, for it has been found that many such comb devices fail to operate correctly due to an inhomogeneous stress gradient in the polysilicon layer which leads to the comb fingers bending in an undesirable manner. The repelling electrostatic charges on adjacent, or opposed, structural components of a MEMS microstructure can also be used to maintain proper spacing between fixed components, and to overcome the sticking of microstructures due to Van der Waals effects.

It should be noted that double-sided cantilevered MEMS structures such as that illustrated in FIGS. 4 and 5 can be readily utilized as mechanical switches. In such a structure, wherein conductive layers 82 and 84 are provided above and below the movable beam in a "sandwich" configuration, a mechanical equilibrium state is not used, or provided, for the switching operation. Two stable operational states are electrostatically actuated in this case, and the elastic constant of the cantilever is not an essential part of the switching operation. In accordance with this design, much better temperature insensitivity is provided, and the device can be scaled for high speed at low voltages. The two stable states of the switch are obtained by the vertical displacement of the central beam 80. The thin, weak cantilever formed by connecting layer 76 at the central beam is only used for holding the beam in place during processing and for electrical connection. The structure is fabricated in highly doped polysilicon for resistance to contamination and wear, while contacts are provided on the movable beam for the switch operation. This "sandwich" structure may be utilized for a wide range of device applications by controlling the mobile floating charges.

Although not illustrated, it will be understood that suitable control circuitry for the EEPROM devices and circuitry for connection to the conductive plates and other components of the illustrated structures will be provided on the substrate in conventional manner. Since EEPROM devices, MEMS components and control circuits have different voltage requirements, integrated circuits that can perform efficient voltage conversion and pumping in wide ranges is necessary for these devices. Such control circuits are conventional and are not described. However, it will be understood that such circuitry will be connected in conventional manner during the fabrication process for sensing signals induced in the conductive plates by the motion of the adjacent moving or vibrating electrostatically charged membranes, for regulating electrostatic charges to adjust the mechanical characteristics of movable devices, for causing motion in such devices, or simply to maintain desired spacing between movable components to significantly reduce friction and wear in micromechanical structures.

Although the invention has been described in terms of preferred embodiments, it will be understood that numerous modifications and variations can be made without departing from the true spirit and scope of the invention, as set forth in the following claims.

What is claimed is:

1. A microstructure incorporating floating nonvolatile electrostatic charges comprising:

first and second spaced, relatively movable microelectromechanical components, each said component including an electrically conductive or semiconductive segment capable of receiving and retaining an electrostatic charge, wherein at least one of said components is a floating gate structure; and a source of nonvolatile electrical charges comprising an exterior floating gate operable to inject into said floating gate structure a nonvolatile floating electrostatic charge of selected polarity to produce an electrically floating electrode.

2. The microstructure of claim 1, wherein said source is variable to regulate the amount and the polarity of the electrostatic charge in said floating electrode.

3. The microstructure of claim 1 wherein said source is operable to inject nonvolatile electrostatic charges of selected polarity and amplitude into the conductive or semiconductive segments of said first and said second components.

4. The microstructure of claim 3, wherein said first component is fixed and said second component is movable.

5. The microstructure of claim 1, further including a third component incorporating a conductive or semiconductive segment and spaced from said first and second components, said first and third components being fixed and said second component being movably mounted between said first and second components, said source being operable to inject said nonvolatile floating electrostatic charge into said segment of said second component to form said electrically floating electrode.

6. The microstructure of claim 5, wherein said source is further operable to inject a nonvolatile electrostatic charges of selected polarity and amplitude into said segments of said first and third components.

7. A microstructure incorporating floating nonvolatile electrostatic charges, comprising:

first, second and third spaced microelectromechanical components, each said component including an electrically conductive or semiconductive segment capable of receiving and retaining an electrostatic charge, said first and third components being fixed and said second component being movably mounted between said first and second components, and first, second and third semiconductor devices integral with said first, second and third components and operable to inject nonvolatile electrostatic charges of selected polarity and amplitude into said segments of said first, second and third components respectively, and to produce in said second component an electrically floating electrode.

8. The microstructure of claim 7, wherein said semiconductor devices integral with said first and third components are separated from said components after charge injection.

9. The microstructure of claim 7, wherein said semiconductor devices are controllable to regulate the charges injected into their respective component segments.

10. The microstructure of claim 9, wherein each said semiconductor device is an electrically erasable programmable read-only memory device.

11. The microstructure of claim 7, wherein said second component is mounted to have a resonant frequency dependent upon the values of said electrostatic charges of said first, second and third components.

12. The microstructure of claim 7, wherein said electrostatic charges on said first, second and third components have the same polarity.

13. The microstructure of claim 7, wherein said second component has a dimension that is less than about 100 $\mu$m.

14. The microstructure of claim 7, wherein said third electrode is a cantilever having a first, fixed end and having a second end extending over said first and second components.

15. A microstructure incorporating floating nonvolatile electrostatic charges, comprising:

first and second spaced fixed microelectromechanical components each including an electrically conductive or semiconductive segment capable of receiving and retaining an electrostatic charge;

a third microelectromechanical component incorporating a conductive or semiconductive segment and having a first, fixed end and a second movable end extending between said first and second components;

a semiconductor source of nonvolatile electrical charges operable to inject into said segment of said third component a nonvolatile floating electrostatic charge of selected polarity to produce an electrically floating electrode, said fixed end of said third component being integral with said source.

16. The microstructure of claim 15, wherein said semiconductor device is separable from said third component.

17. The microstructure of claim 1, wherein said at least one of said components is rotatable with respect to the other of said components.

18. A microstructure incorporating floating nonvolatile charges, comprising:
   first and second spaced, relatively movable microelectromechanical components, each said component including an electrically conductive or semiconductive segment capable of receiving and retaining electrostatic charges; and
   a source of nonvolatile electrical charges operable to inject into the conductive or semiconductive segment of at least one of said components a nonvolatile floating electrostatic charge of selected polarity to produce an electrically floating electrode, wherein said source is an electrically erasable programmable read-only (EEPROM) having a gate electrically connected to said segment of said second component, said EEPROM being operable to controllably inject electrostatic charges into said second component segment.

19. The microstructure of claim 18, further including a third component spaced from said first and second components, with said second component being movable between said first and third components.

20. The microstructure of claim 19, wherein said second component is released from said EEPROM following electrostatic charge injection to provide a mechanically free-floating electrode.

21. The microstructure of claim 19, wherein said EEPROM is controllable to regulate the motion of said second component with respect to said first and third components.

22. The microstructure of claim 19, further including nonvolatile electrostatic charges on said first and third components, the charges on said first, second and third components being the same polarity to produce repelling forces between said components.

23. The microstructure of claim 22, wherein said second component comprises multiple floating electrodes, each electrically connected to a corresponding EEPROM to enable each floating electrode to carry a different charge.

24. The microstructure of claim 23, wherein each of said floating electrodes has a shape selected to provide specific motion characteristics with respect to said first and third components.

25. The microstructure of claim 22, wherein said second component protrudes out of the space between said first and third components.

26. The microstructure of claim 19, wherein said second component is a membrane incorporating nanometer-scale conductive metal crystals.

27. A microstructure incorporating floating nonvolatile charges, comprising:
   first and second spaced, relatively movable microelectromechanical components, each said component including an electrically conductive or semiconductive segment capable of receiving and retaining electrostatic charges; and
   a source of nonvolatile electrical charges operable to inject into the conductive or semiconductive segment of at least one of said components a nonvolatile floating electrostatic charge of selected polarity to produce an electrically floating electrode, wherein said source includes a first electrically erasable programmable read-only memory (EEPROM) having a gate electrically connected to said second component, said first and second components comprising a microelectromechanical comb-type actuator, said components having multiple spaced, parallel interdigitated fingers.

28. The microstructure of claim 27, wherein each said EEPROM is connected and operable to inject repelling electrostatic charges on adjacent components.

29. A microstructure, comprising:
   first and second spaced, relatively movable microelectromechanical components capable of receiving and retaining an electrostatic charge; and
   first and second active controllable semiconductor devices connected to inject into a corresponding one of said first and second components nonvolatile electrostatic charges of selected amplitude and polarity.

30. The microstructure of claim 29, wherein at least one of said components incorporates nanocrystals for receiving and retaining said electrostatic charges.

31. The microstructure of claim 30, wherein each said semiconductor device is an electrically erasable programmable read-only memory (EEPROM) having a gate electrically connected to its corresponding component.

32. The microstructure of claim 31, wherein each said EEPROM is releasable from its corresponding component.

33. The microstructure of claim 29, wherein said first component is rotable with respect to said second component, and wherein said charges are of the same polarity to provide a frictionless hinge.

34. The microstructure of claim 29, wherein said first component is linearly movable with respect to said second component, and wherein said components incorporate interdigitated fingers to provide a comb structure.

35. The microstructure of claim 29, further including means for detecting the relative motion of said components.

36. The microstructure of claim 29, further including means for producing relative motion of said first component with respect to said second component.

37. The microstructure of claim 29, further including:
   a third component spaced from and relatively fixed with respect to said first component, said second component being located between and relatively movable with respect to said first and third components; and
   a third active controllable semiconductor device connected to inject nonvolatile electrostatic charges of selected amplitude and polarity into said third component.

38. The microstructure of claim 37, wherein said charges on said first, second and third components are selected to position said second component between said first and third components.

39. The microstructure of claim 38, wherein said semiconductor devices are electrically erasable programmable read-only memory (EEPROM) devices.

40. The microstructure of claim 39, wherein said second component comprises a movable beam incorporating nanocrystals.

41. The microstructure of claim 40, wherein said EEPROM devices are releasable from said components.

42. The microstructure of claim 41; further including means for detecting motion of said second movable beam with respect to said first and third components.

43. The microstructure of claim 41, further including means for moving said movable beam with respect to said first and third components for generating electrical or electromagnetic waves.

44. A microstructure, comprising:
   first, second and third spaced parallel microelectromechanical electrodes capable of receiving and retaining an injected nonvolatile electrostatic charge, said second electrode being located between and movable with respect to said first and third electrodes; and at least one electrically erasable programmable read-only memory (EEPROM) device having a gate electrically connected to, and releasable from, said first, second and third electrodes and operable to inject nonvolatile electrostatic charges into said electrodes.

45. The microstructure of claim 44, wherein said electrostatic charges are of the same polarity, so that said second electrode is repelled by said first and second electrodes.

46. The microstructure of claim 45, wherein said EEPROM is operable to vary the charges on said second electrode to vary the effective mechanical properties of said second electrode.

47. The microstructure of claim 46, wherein the shape of said second electrode is,selected to provide specific mechanical resonance properties.

48. The microstructure of claim 45, wherein said second electrode is movable to generate power.

49. The microstructure of claim 44, wherein said second electrode comprises a movable beam having a thin film layer incorporating conductive nanometer-scale crystals for receiving and retaining said nonvolatile electrostatic charges.

50. The microstructure of claim 44, wherein said second electrode is mounted as a cantilever for motion between and with respect to said first and second electrodes.

51. The microstructure of claim 50, wherein said second electrode protrudes into free space with respect to said first and third electrodes, whereby motion of said second electrode produces electromagnetic wave emission.

52. The microstructure of claim 51, wherein said second electrode is an electrostatically charged membrane containing metal nanocrystals.

53. The microstructure of claim 51, wherein the electrostatic charges on said first, second and third electrodes are selected to regulate the resonant frequency of motion of said second electrode.

* * * * *